United States Patent
Brunolli et al.

(10) Patent No.: US 6,201,491 B1
(45) Date of Patent: Mar. 13, 2001

(54) DIGITALLY SWITCHED POTENTIOMETER HAVING IMPROVED LINEARITY AND SETTLING TIME

(75) Inventors: Michael Brunolli, Escondido; Chinh Hoang, San Diego, both of CA (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 09/491,842

(22) Filed: Jan. 26, 2000

(51) Int. Cl.[7] ..................................................... H03M 1/66
(52) U.S. Cl. .......................... 341/144; 341/145; 341/154
(58) Field of Search .................................... 341/144, 154, 341/145, 118, 155

(56) References Cited

U.S. PATENT DOCUMENTS 5,495,245 * 2/1996 Ashe ....................................... 341/145
5,764,174 * 6/1998 Dempsey et al. ..................... 341/154
6,037,889 * 3/2000 Knee ...................................... 341/154

* cited by examiner

Primary Examiner—Brian Young
Assistant Examiner—John B Nguyen
(74) Attorney, Agent, or Firm—Baker Botts L.L.P.

(57) ABSTRACT

A digitally switched potentiometer has improved linearity by minimizing the amount of resistive error introduced by switches used to switch the resistive elements comprising the potentiometer. Improved settling time of the potentiometer is achieved by reducing the amount of switch capacitance connected to the output of the potentiometer. The digitally switched potentiometer may be fabricated on an integrated circuit die and the switches may be fabricated with complementary metal oxide semiconductor (CMOS) transistors. The number of resistors needed for a desired number of resistive step changes is reduced by using two major resistor ranks and one minor resistor rank, or two minor resistor ranks and one major resistor rank connected in series.

24 Claims, 10 Drawing Sheets

| Vcc | Bin | S₁ | S₂ | S₃ | S₄ | S₅ | S₆ | S₇ | S₈ | S₉ | S₁₀ | S₁₁ | S₁₂ |
|---|---|---|---|---|---|---|---|---|---|---|---|---|---|
| 16/16 | 1111 | X | | | | | | | X | X | | | |
| 15/16 | 1110 | | X | | | | | | X | | X | | |
| 14/16 | 1101 | | | X | | | | | X | | | X | |
| 13/16 | 1100 | | | | X | | | | X | | | | X |
| 12/16 | 1011 | X | | | | | | X | | X | | | |
| 11/16 | 1010 | | X | | | | | X | | | X | | |
| 10/16 | 1001 | | | X | | | | X | | | | X | |
| 9/16 | 1000 | | | | X | | | X | | | | | X |
| 8/16 | 0111 | X | | | | | X | | | X | | | |
| 7/16 | 0110 | | X | | | | X | | | | X | | |
| 6/16 | 0101 | | | X | | | X | | | | | X | |
| 5/16 | 0100 | | | | X | | X | | | | | | X |
| 4/16 | 0011 | X | | | | X | | | | X | | | |
| 3/16 | 0010 | | X | | | X | | | | | X | | |
| 2/16 | 0001 | | | X | | X | | | | | | X | |
| 1/16 | 0000 | | | | X | X | | | | | | | X |

FIGURE 4

| Vcc | Bin | $S_1$ | $S_2$ | $S_3$ | $S_4$ | $S_5$ | $S_6$ | $S_7$ | $S_8$ | $S_9$ | $S_{10}$ | $S_{11}$ | $S_{12}$ |
|-----|------|---|---|---|---|---|---|---|---|---|---|---|---|
| 15/16 | 1111 | X |   |   |   |   |   |   | X | X |   |   |   |
| 14/16 | 1110 |   | X |   |   |   |   |   | X |   |   | X |   |
| 13/16 | 1101 |   |   | X |   |   |   |   | X |   |   | X |   |
| 12/16 | 1100 |   |   |   | X |   |   |   | X |   |   |   | X |
| 11/16 | 1011 | X |   |   |   |   |   | X |   | X |   |   |   |
| 10/16 | 1010 |   | X |   |   |   |   | X |   |   | X |   |   |
| 9/16  | 1001 |   |   | X |   |   |   | X |   |   |   | X |   |
| 8/16  | 1000 |   |   |   | X |   |   | X |   |   |   |   | X |
| 7/16  | 0111 | X |   |   |   |   | X |   |   | X |   |   |   |
| 6/16  | 0110 |   | X |   |   |   | X |   |   |   | X |   |   |
| 5/16  | 0101 |   |   | X |   |   | X |   |   |   |   | X |   |
| 4/16  | 0100 |   |   |   | X |   | X |   |   |   |   |   | X |
| 3/16  | 0011 | X |   |   |   | X |   |   |   |   | X |   |   |
| 2/16  | 0010 |   | X |   |   | X |   |   |   |   |   | X |   |
| 1/16  | 0001 |   |   | X |   | X |   |   |   |   |   | X |   |
| 0/16  | 0000 |   |   |   | X | X |   |   |   |   |   |   | X |

FIGURE 6

| Vcc | Bin | $S_1$ | $S_2$ | $S_3$ | $S_4$ | $S_5$ | $S_6$ | $S_7$ | $S_8$ | $S_9$ | $S_{10}$ | $S_{11}$ | $S_{12}$ |
|---|---|---|---|---|---|---|---|---|---|---|---|---|---|
| 16/16 | 1111 | X | | | | | | | X | X | | | |
| 15/16 | 1110 | X | | | | | | X | | X | | | |
| 14/16 | 1101 | X | | | | | X | | | X | | | |
| 13/16 | 1100 | X | | | | X | | | | X | | | |
| 12/16 | 1011 | | X | | | | | | X | | X | | |
| 11/16 | 1010 | | X | | | | | X | | | X | | |
| 10/16 | 1001 | | X | | | | X | | | | X | | |
| 9/16 | 1000 | | X | | | X | | | | | X | | |
| 8/16 | 0111 | | | X | | | | | X | | | X | |
| 7/16 | 0110 | | | X | | | | X | | | | X | |
| 6/16 | 0101 | | | X | | | X | | | | | X | |
| 5/16 | 0100 | | | X | | X | | | | | | X | |
| 4/16 | 0011 | | | | X | | | | X | | | | X |
| 3/16 | 0010 | | | | X | | | X | | | | | X |
| 2/16 | 0001 | | | | X | | X | | | | | | X |
| 1/16 | 0000 | | | | X | X | | | | | | | X |

FIGURE 8

| Vcc | Bin | $S_1$ | $S_2$ | $S_3$ | $S_4$ | $S_5$ | $S_6$ | $S_7$ | $S_8$ | $S_9$ | $S_{10}$ | $S_{11}$ | $S_{12}$ |
|---|---|---|---|---|---|---|---|---|---|---|---|---|---|
| 15/16 | 1111 | X |   |   |   |   |   |   | X | X |   |   |   |
| 14/16 | 1110 | X |   |   |   |   |   | X |   | X |   |   |   |
| 13/16 | 1101 | X |   |   |   |   | X |   |   | X |   |   |   |
| 12/16 | 1100 | X |   |   |   | X |   |   |   | X |   |   |   |
| 11/16 | 1011 |   | X |   |   |   |   |   | X |   | X |   |   |
| 10/16 | 1010 |   | X |   |   |   |   | X |   |   | X |   |   |
| 9/16  | 1001 |   | X |   |   |   | X |   |   |   | X |   |   |
| 8/16  | 1000 |   | X |   |   | X |   |   |   |   | X |   |   |
| 7/16  | 0111 |   |   | X |   |   |   |   | X |   |   | X |   |
| 6/16  | 0110 |   |   | X |   |   |   | X |   |   |   | X |   |
| 5/16  | 0101 |   |   | X |   |   | X |   |   |   |   | X |   |
| 4/16  | 0100 |   |   | X |   | X |   |   |   |   |   | X |   |
| 3/16  | 0011 |   |   |   | X |   |   |   | X |   |   |   | X |
| 2/16  | 0010 |   |   |   | X |   |   | X |   |   |   |   | X |
| 1/16  | 0001 |   |   |   | X |   | X |   |   |   |   |   | X |
| 0/16  | 0000 |   |   |   | X | X |   |   |   |   |   |   | X |

FIGURE 10

DIGITALLY SWITCHED POTENTIOMETER HAVING IMPROVED LINEARITY AND SETTLING TIME

FIELD OF THE INVENTION

This invention relates generally to digitally controlled potentiometers, and more particularly, to digital potentiometers having enhanced linearity and faster settling times.

BACKGROUND OF THE RELATED TECHNOLOGY

Digital potentiometers, sometimes referred to as "voltage-scaling digital-to-analog converters ("DACs"), are replacing analog potentiometers because they are smaller, more easily and accurately set, are controllable remotely, and are becoming lower in cost. The fineness of adjustment or "granularity" of the digital potentiometer is determined by the number of "digital bits" used for the selection of the desired resistance value, i.e., 8 bits allows 256 different resistance selections, 10 bits allows 1024, etc. A disadvantage to finer adjustment granularity (more digital bits) is the rapid increase in the number of components (resistors, switches, decoders and logic circuits) required to implement the digital potentiometer.

Voltage-scaling DACs produce an analog output voltage by selectively tapping a voltage-divider resistor string connected between high and low reference voltages, with the low reference generally being set at ground. These types of converters are used most commonly as building blocks in metal oxide semiconductor ("MOS") analog-to-digital conversion systems, where they function as the DAC subsection of a successive-approximation-type analog-to-digital converter. For an N-bit voltage-scaling DAC, the resistor string consists of $2^N$ identical resistors connected in series, and the DAC is used as a potentiometer in which the voltage levels between the successive series-connected resistors are sampled by means of binary switches. Replacing mechanical potentiometers and rheostats is an important and potentially very high volume application for these devices.

FIG. 1 is a schematic diagram of an N-bit DAC that operates on the voltage-scaling principle. A resistor string consisting of series-connected resistors R1, R2, R3, . . . , $R2^{N-1}$, $R2^N$ is connected between a high reference voltage (VREF+) node 2 and a low reference voltage (VREF−) node 4, which are typically 5 volts and ground potential, respectively. The voltage drop across each resistor is equal to one least significant bit (LSB) of output voltage change. The output is sampled by a decoding switch network, illustrated as switches S1, S2, S3, . . . , $S2^N$. Each switch taps a different point in the resistor string, so that closing a particular switch while leaving the other switches open places a unique analog voltage on a common output line 6 to which each of the switches is connected. A decoder (not shown) controls the operation of the switches so that the switch whose voltage corresponds to the magnitude of the input digital signal is closed. The signal on analog output line 6 may be sensed by a high-impedance buffer amplifier or voltage follower A1, the output of which is connected to an output terminal 8 that provides the final output analog voltage. To ensure the accuracy of the conversion, the buffer amplifier should draw negligible DC bias current compared to the current within the resistor string. A principal drawback of this type of circuit for high-bit-count D/A conversions is the very large number of components required: $2^N$ resistors, $2^N$ switches and $2^N$ logic drive lines. For example, in a 12-bit implementation, this approach would use 4,096 resistors, 4,096 switches and 4,096 logic drive lines. It is highly desirable to significantly reduce this large number of elements for purposes of area savings, higher manufacturing yields and lower costs.

Voltage-scaling DACs are presently available which greatly reduce the number of required resistors and switches by using one resistor string consisting of $2^{N/2}$ resistors for the input digital signal's most significant bits (MSBs), and a separate resistor string also consisting of $2^{N/2}$ resistors for the least significant bits (LSBs). Each resistor in the LSB string has a resistance value equal to $\frac{1}{2}^{N/2}$ the resistance of each MSB resistor. The opposite ends of the LSB string are connected across one of the MSB resistors. By varying the MSB resistor selected for the LSB string connection and taking an output from the LSB string, outputs in one LSB increments can be obtained over the full range of one to $2^{N/2}-1$ LSBs.

A reduced parts count resistor-switch configuration for a digital potentiometer is disclosed in U.S. Pat. No. 5,495,245 by James J. Ashe. Referring now to FIG. 2, the digital potentiometer disclosed in the Ashe patent uses two outer strings 10 and 12 to provide a decremented voltage pattern that supplies an analog signal corresponding to the MSBs of the input digital signal while an inner string 14 provides an analog signal corresponding to the LSBs; alternately, the outer strings can provide the LSBs and the inner string the MSBs. The two outer strings 10 and 12 are identical, with the high voltage end of the first outer string connected to the high reference voltage, VREF+ and the low voltage end of the second outer string 12 connected to the low reference voltage, VREF−. The opposite ends of the inner string 14 are connected to the first and second outer strings, 10 and 12, through respective outer switch networks that are operated by a decoder (not illustrated), the decoder in effect causes the opposite ends of the inner string to "slide" along the two outer strings. This "sliding" keeps a constant number of outer string resistors in the circuit, regardless of where the outer strings are tapped. No active elements are required to buffer the inner string from the outer string, which allows the circuit disclosed to be used as a potentiometer or rheostat. The output voltage is obtained by tapping a desired location in the inner string 14. In the Ashe invention, regardless of whether the MSB values are produced by the inner or outer strings, each MSB resistor string includes $2^{N/2}-1$ resistors of resistance value R, and $2^{N/2}$ switches. Each LSB string includes $2^{N/2}$ resistors of resistance value $R/2^{N/2}$, and $2^{N/2}$ switches. The Ashe digital potentiometer results in a significant reduction in the number of both resistors and switches, compared to the potentiometer circuit illustrated in FIG. 1.

The digital potentiometer disclosed in Ashe has inherent non-linearity due to resistor, interconnect and switch resistance mismatches, and also long switching settling times caused by large internal capacitance from the parallel connected switches located on the output taps of the MSB resistor strings.

Therefore, what is needed is a digital potentiometer which retains the simplicity and economy of having a reduced number of resistors and switches in a combination of major and minor resistor strings and switches, but having improved linearity and reduced settling times when resistance values are switched.

SUMMARY OF THE INVENTION

The invention overcomes the above-identified problems as well as other shortcomings and deficiencies of existing technologies by providing a digital potentiometer having improved linearity and reduced settling times when resistance values are switched. An embodiment of the present invention digital potentiometer may be fabricated on an integrated circuit die using complementary metal oxide semiconductor (CMOS) transistors for the switches.

An embodiment of the invention uses two scaled minor resistor strings (LSB) as the upper and lower ranks, and a major resistor string (MSB) as the bridge rank connected between the upper and lower ranks. The switches for the upper and lower ranks are connected between the respective voltage references and the series-connected resistors of the upper and lower ranks. Additional switches are connected from the bridge rank (MSB) resistors to the output node (wiper) of the digital potentiometer. The MSB portion of the digital value is selected with one of the bridge rank switches, and the LSB portion of the digital value is selected with a pair of switches connected to the upper and lower ranks. A varying portion of the upper and lower ranks are connected with the bridge rank, and the total available tap points equals the product of the number of taps on the bridge rank times the number of taps on one of the other (upper or lower) ranks.

The overall linearity of the digital potentiometer circuit of the present invention is significantly improved over the prior art digital potentiometer circuits because the majority of the total resistance is always used for the total resistance value of the potentiometer. Unlike the prior art digital potentiometers where up to 50 percent of the total resistance involves the swapping of resistors. The matching requirements of the upper and lower ranks are now reduced to the scaled resistor values, and the matching level to guarantee monotonicity is also reduced by the same factor.

Also, all the switches in the upper rank see the same constant biasing voltage (meaning they have the same constant resistance) as opposed to what happens in the prior art where the biasing voltage of each switch varies with its position in the rank. The same also is true for the switches in the lower rank. Thus, there is no need to size each switch independently to match all their resistances.

Alternating current (AC) performance of the present invention is also improved over the prior art because the voltage levels at the upper and lower rank switches are now limited to a small fraction of their former range, that fraction being one over the number of resistors in the major rank (bridge rank). A reduction in the capacitance contribution from the switches results in better settling time and improved AC response. The switch placement of the present invention further improves the AC performance by removing the switch capacitance from the settling nodes of the common signal bus. The settling time is now only affected by the capacitance of the resistors of all ranks and just the bridge rank switches.

Another embodiment of the invention uses two scaled major resistor strings (MSB) as the upper and lower ranks, and a minor resistor string (LSB) as the bridge rank connected between the upper and lower ranks. The switches for the upper and lower ranks are connected between the respective voltage references and the series-connected resistors of the upper and lower ranks. Additional switches are connected from the bridge rank resistors to the output node (wiper) of the digital potentiometer. The LSB portion of the digital value is selected with one of the bridge rank switches, and the MSB portion of the digital value is selected with a pair of switches connected to the upper and lower ranks.

Features and advantages of the invention will be apparent from the following description of presently preferred embodiments, given for the purpose of disclosure and taken in conjunction with the accompanying drawings.

BRIEF DESCRIPTION OF THE DRAWINGS

FIG. 4 is a table of switches activated for a desired combination of resistors of the embodiment illustrated in FIG. 3;

FIG. 6 is a table of switches activated for a desired combination of resistors of the embodiment illustrated in FIG. 5;

FIG. 8 is a table of switches activated for a desired combination of resistors of the embodiment illustrated in FIG. 7;

FIG. 10 is a table of switches activated for a desired combination of resistors of the embodiment illustrated in FIG. 9.

DETAILED DESCRIPTION OF THE PREFERRED EMBODIMENT

Figure 1:
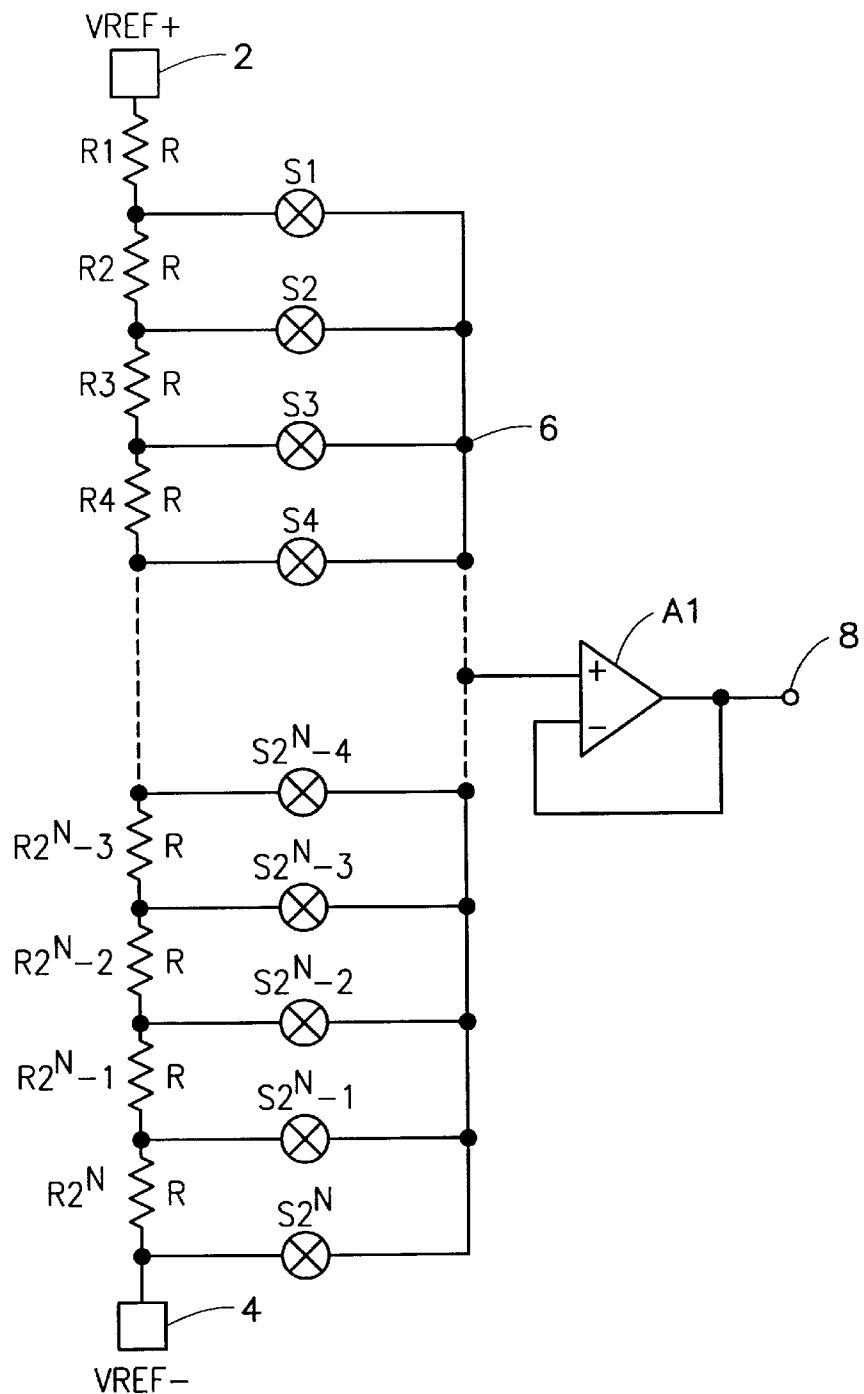
FIG. 1 is schematic diagram of a prior art digital potentiometer.
Figure 2:
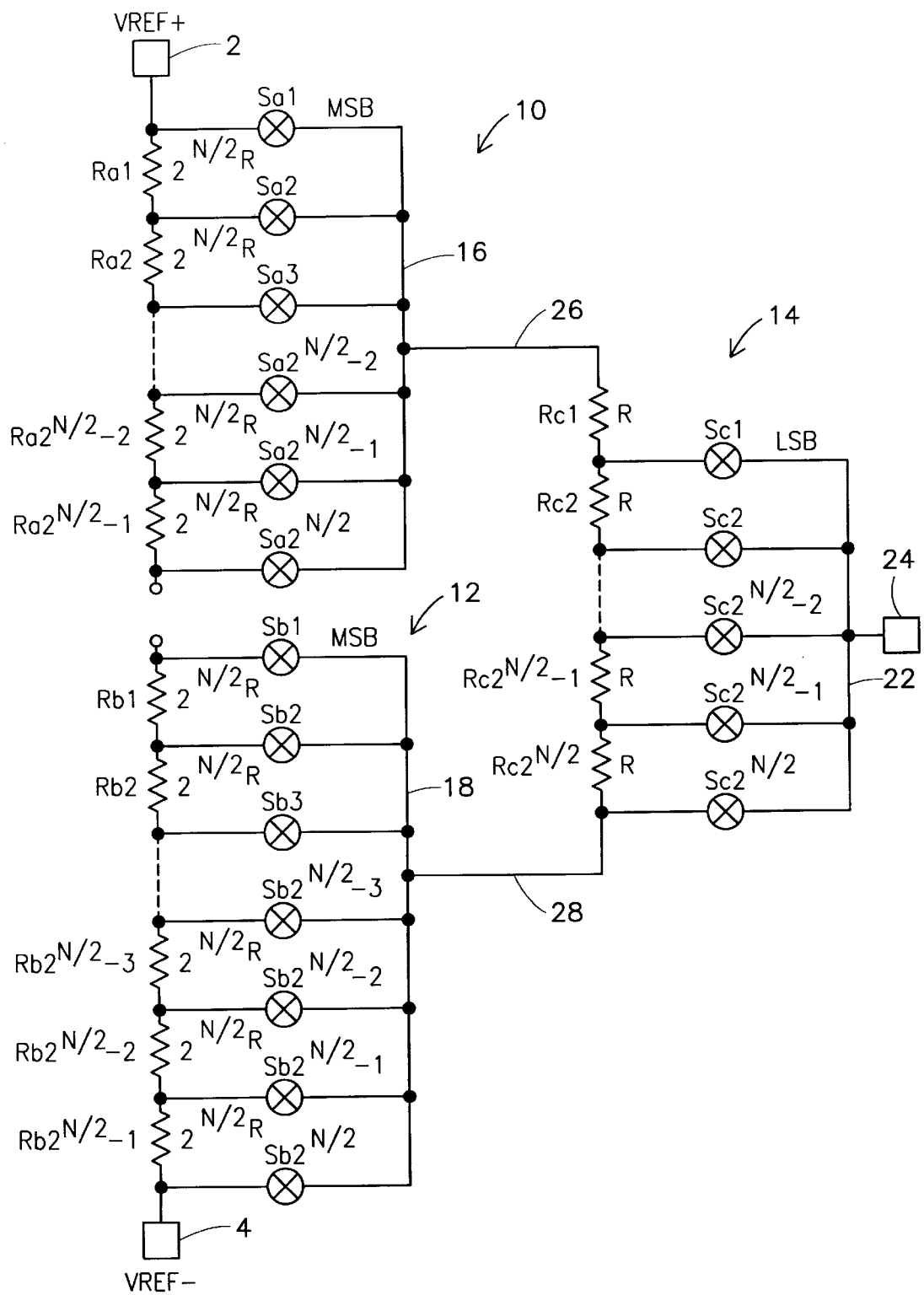
FIG. 2 is a schematic diagram of a more efficiently connected prior art digital potentiometer.

The invention provides a digital potentiometer having improved linearity and reduced settling times when resistance values are changed by switching. Embodiments of the invention may be fabricated on an integrated circuit die, either individually or in combination with other analog and digital functions (circuits), and packaged in an integrated circuit package. Standard implementations for resistors, switches and other circuits fabricated on the integrated circuit die may be used and are well known to those skilled in the art of analog and digital integrated circuit design and fabrication. N-channel and P-channel metal oxide semiconductor (NMOS and PMOS), complementary metal oxide semiconductor (CMOS), bipolar transistor, junction field effect transistor (JFET), insulated gate field effect transistor (IGFET) and the like, may be used to implement the switches and other circuits according to the embodiments of the present invention. The present invention may be used in digitally controlled potentiometers, digital-to-analog converters and the like.

Instead of a continuous resistor string of $2^N$ resistors, the embodiments of the invention utilize a segmented resistor string consisting of two outer strings and one inner string. The outer strings may vary the input digital signal's LSBs and the inner string the MSBs, or vice versa. The two outer strings have substantially the structures, and vary their portion of the input digital signal by "sliding" the inner string through the outer strings, such that equal numbers of resistors are added to the decrementing circuit by one outer string and subtracted by the other outer string for each change (LSBs or MSBs) in the digital input.

In the embodiments of the present invention having the outer strings controlled by the LSBs of the digital input and the inner string controlled by the MSBs, the connected total resistance combination of the two outer strings (LSBs) equals the resistance of one of the inner string resistors (MSBs). In the embodiments of the present invention having the outer strings controlled by the MSBs of the digital input and the inner string controlled by the LSBs, the connected total resistance combination of the inner string resistors (LSBs) equals the resistance of one of the resistors in the outer strings (MSBs). (The number of resistors, switches and the switches' positions in each string will be slightly different compared to the first case).

The total connected resistance of the digital potentiometer (from one input node to the other), according to the embodiments of the present invention, is $2^{N/2}$ times the resistance value of one MSB resistor (whether either in the inner or outer strings). The resistive granularity or number of resistive step changes possible is equal to $2^N$ in increments of the LSB resistor value, where N is a positive even integer value, i.e., N=2, 4, 6, 8, etc.

The resistive sum of the connected outer string resistors (LSB) having $2^{N/2}$ resistors preferably equals the resistance of one of the inner string resistors (for inner string MSB). The resistance value of one of the outer string resistors (LSB) is preferably $2^{-N/2}$ of the resistive sum of the outer string resistors (LSB), where N is a positive even integer value, i.e., N=2, 4, 6, 8, etc.

The resistive sum of the inner string resistors (LSB) preferably equals the resistance of one of the outer string resistors (for outer string MSB). The resistance value of one of the inner string resistors (LSB) is preferably $2^{-N/2}$ of the resistive sum of the inner string resistors (LSB), where N is a positive even integer value, i.e., N=2, 4, 6, 8, etc.

All of the outer string resistors are substantially of the same value, and all of the inner string resistors are substantially of the same value.

The number of resistors used for an MSB inner string is $2^{N/2}-1$, the number of resistors used for one of the LSB strings is $2^{N/2}$, the number of resistors used for the other LSB outer string is $2^{N/2}-1$, and the number of switches used for each of the strings is $2^{N/2}$, where N is a positive even integer value, i.e., N=2, 4, 6, 8, etc.

The number of resistors used for an LSB inner string is $2^{N/2}$, the number of resistors used for one of the MSB outer strings is $2^{N/2}-1$ and $2^{N/2}$ for the other string. The number of switches used for each of the strings is $2^{N/2}$, where N is a positive even integer value, i.e., N=2, 4, 6, 8, etc.

All of the embodiments illustrated and described hereinbelow use four bit binary control examples for illustrative clarity. One of ordinary skill in the art of digital and analog electronics will readily appreciate that the embodiments of the present invention are equally applicable to any number of binary bits for a control word along with an appropriate number of switches and resistors to match the number of binary bits used.

Referring now to the drawings, the details of preferred embodiments of the invention are schematically illustrated. Elements in the drawings that are the same will be represented by the same numbers, and similar elements will be represented by the same numbers with a different lower case letter suffix.

Figure 3:
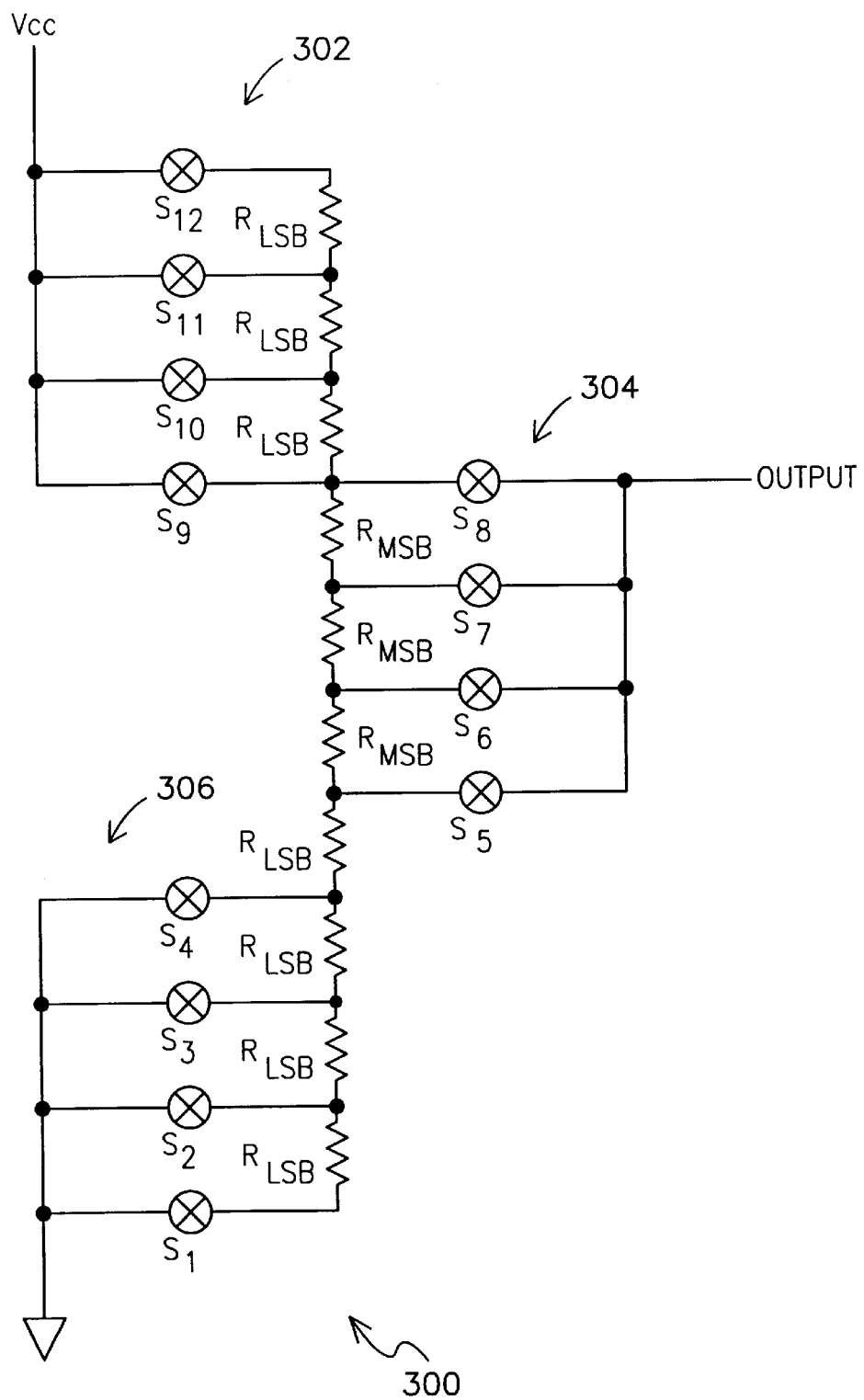
FIG. 3 is a schematic diagram of an embodiment of the invention.

Referring to FIG. 3, a schematic diagram of a digital potentiometer, according to an embodiment of the invention, is illustrated. The digital potentiometer is generally referenced by the numeral 300 and comprises a plurality of resistors $R_{LSB}$ and $R_{MSB}$, and a plurality of switches $S_1$–$S_{12}$ connected as illustrated. The resistors $R_{LSB}$ are associated with the switches $S_1$–$S_4$ and $S_9$–$S_{12}$. The resistors $R_{MSB}$ are associated with the switches $S_5$–$S_8$. The switches $S_1$–$S_4$ and associated resistors $R_{LSB}$ are connected in string 306. The switches $S_5$–$S_8$ and associated resistors $R_{MSB}$ are connected in string 304. The switches $S_9$–$S_{12}$ and associated resistors $R_{LSB}$ are connected in string 302.

A respective switch control line (not illustrated) is connected to each of the switches $S_1$–$S_{12}$, and used to activate each of the switches $S_1$–$S_{12}$. The switch control lines may be further controlled by a digital signal coded in binary, octal, decimal, hexadecimal, etc., which may be decoded by an application specific integrated circuit (ASIC), programmable logic array (PLA) or as a digital word from a microcontroller. Control signals are placed on the appropriate switch control lines to activate the desired switches so as to produce the desired resistance value for the digital potentiometer.

The switches $S_1$–$S_4$ and $S_9$–$S_{12}$ are located between the two input reference nodes, Vcc and ground, and the resistors $R_{LSB}$. This configuration helps in reducing the amount of capacitance associated with the output node. Reduced output node capacitance results in faster settling times after a switch change operation and improved alternating current (AC) frequency response.

The placement of the switches $S_1$–$S_4$ in the string 306 and $S_9$–$S_{12}$ in the string 302 further enhances the linearity of the selected resistance values due to less switch resistance variations caused by the body effect of the field effect transistor (FET) switches. This is because there is a more uniform voltage control between the source-gate junctions of the switch FETs, since the sources of the FETs are now typically connected to either the Vcc node or the ground node and do not float with changing resister values as disclosed in U.S. Pat. No. 5,495,245 by James J. Ashe.

The Vcc node may also be used as a first signal input node, and the ground node may be used as a second signal input node. The output node will then work in conjunction with either the common first or second signal input node.

The switches $S_1$–$S_4$ and $S_9$–$S_{12}$ may be controlled by the least significant bits of a digital word and the switches $S_5$–$S_8$ may be controlled by the most significant bits of the digital word, or visa versa. For illustrative purposes, a four bit digital word will be used for illustration, however, it is contemplated and within the scope of the present invention that embodiments thereof may use any number of bits for the digital word, with the only limitations being costs and complexity for a given application.

Referring now to FIG. 4, a table of switches activated for a desired combination of resistors, according to the embodiment of Figure is 3 illustrated. Fractions of the value of Vcc are represented in the left hand column, four bit binary words are represented in the next column to the right, and switch activation patterns are represented by "X"s in each row representing a fraction of the Vcc value. For example, a binary word of 1111 represents full scale or $^{15}/_{16}$ Vcc, and switches $S_1$, $S_8$ and $S_9$ are closed. A binary word of 0111 represents half scale or $^{8}/_{16}$ Vcc, and switches $S_1$, $S_6$ and $S_9$ are closed. All fractions of Vcc in $^{1}/_{16}$ increments may be obtained, except $^{0}/_{16}$, by appropriate combinations of switch closures as illustrated in FIG. 4. Since there is one extra $R_{LSB}$ in the lower string 306, only $^{1}/_{16}$ to $^{15}/_{16}$ Vcc is obtainable in this embodiment of the present invention. Finer granularity of resistance changes may be obtained with a larger binary control word (more bits) and a corresponding increase in the number of resistors and switches in the strings.

Figure 5:
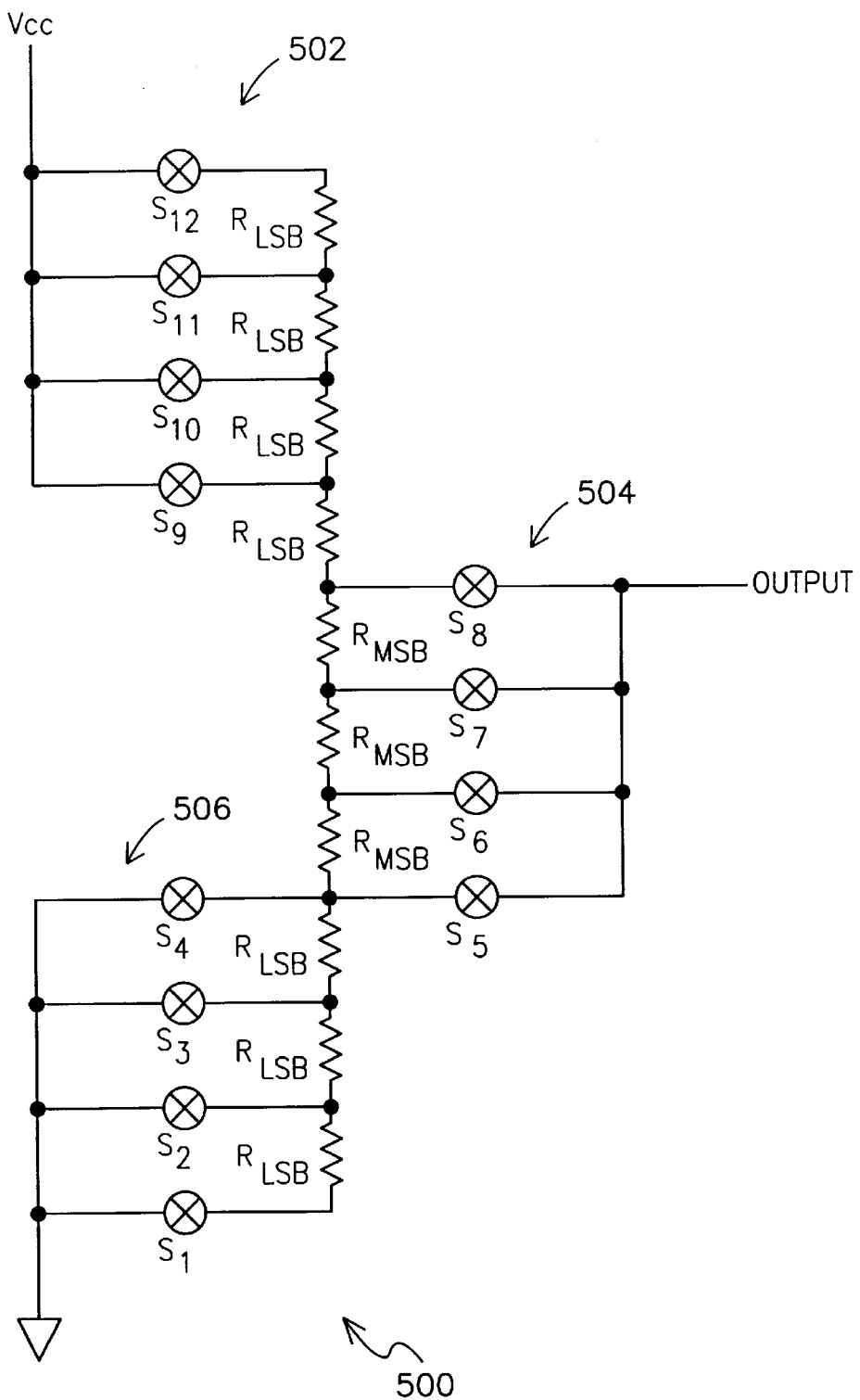
FIG. 5 is a schematic diagram of another embodiment of the invention.

Referring to FIG. 5, a schematic diagram of a digital potentiometer, according to another embodiment of the invention, is illustrated. The digital potentiometer is generally referenced by the numeral 500 and comprises a plurality of resistors $R_{LSB}$ and $R_{MSB}$, and a plurality of switches $S_1$–$S_{12}$ connected as illustrated. The resistors $R_{LSB}$ are associated with the switches $S_1$–$S_4$ and $S_9$–$S_{12}$. The resistors $R_{MSB}$ are associated with the switches $S_5$–$S_8$. The switches $S_1$–$S_4$ and associated resistors $R_{LSB}$ are connected in string 506. The switches $S_5$–$S_8$ and associated resistors $R_{MSB}$ are connected in string 504. The switches $S_9$–$S_{12}$ and associated resistors $R_{LSB}$ are connected in string 502.

A respective switch control line (not illustrated) is connected to each of the switches $S_1$–$S_{12}$, and used to activate each of the switches $S_1$–$S_{12}$. The switch control lines may be further controlled by a digital signal coded in binary, octal, decimal, hexadecimal, etc., which may be decoded by an application specific integrated circuit (ASIC), programmable logic array (PLA) or as a digital word from a microcontroller. Control signals are placed on the appropriate switch control lines to activate the desired switches so as to produce the desired resistance value for the digital potentiometer.

The switches $S_1$–$S_4$ and $S_9$–$S_{12}$ are located between the two input reference nodes, Vcc and ground, and the resistors $R_{LSB}$. This configuration helps in reducing the amount of capacitance associated with the output node. Reduced output node capacitance results in faster settling times after a switch change operation and improved alternating current (AC) frequency response.

The placement of the switches $S_1$–$S_4$ in the string 506 and $S_9$–$S_{12}$ in the string 502 further enhances the linearity of the selected resistance values due to less switch resistance variations caused by the body effect of the field effect transistor (FET) switches. This is because there is a more uniform voltage control between the source-gate junctions of the switch FETs, since the sources of the FETs are now typically connected to either the Vcc node or the ground node and do not float with changing resister values as disclosed in U.S. Pat. No. 5,495,245 by James J. Ashe.

The Vcc node may also be used as a first signal input node, and the ground node may be used as a second signal input node. The output node will then work in conjunction with either the common first or second signal input node.

The switches $S_1$–$S_4$ and $S_9$–$S_{12}$ may be controlled by the least significant bits of a digital word and the switches $S_5$–$S_8$ may be controlled by the most significant bits of the digital word, or visa versa. For illustrative purposes, a four bit digital word will be used for illustration, however, it is contemplated and within the scope of the present invention that embodiments thereof may use any number of bits for the digital word, with the only limitations being costs and complexity for a given application.

Referring now to FIG. 6, a table of switches activated for a desired combination of resistors, according to the embodiment of Figure is 5 illustrated. Fractions of the value of Vcc are represented in the left hand column, four bit binary words are represented in the next column to the right, and switch activation patterns are represented by "X"s in each row representing a fraction of the Vcc value. For example, a binary word of 1111 represents 15/16 Vcc, and switches $S_1$, $S_8$ and $S_9$ are closed. A binary word of 1000 represents half scale or 8/16 Vcc, and switches $S_4$, $S_7$ and $S_{12}$ are closed. All fractions of Vcc in 1/16 increments may be obtained, except 16/16, by appropriate combinations of switch closures as illustrated in FIG. 6. Since there is one extra $R_{LSB}$ in the upper string 502, only 0/16 to 15/16 Vcc is obtainable in this embodiment of the present invention. Finer granularity of resistance changes may be obtained with a larger binary control word (more bits) and a corresponding increase in the number of resistors and switches in the strings.

Figure 7:
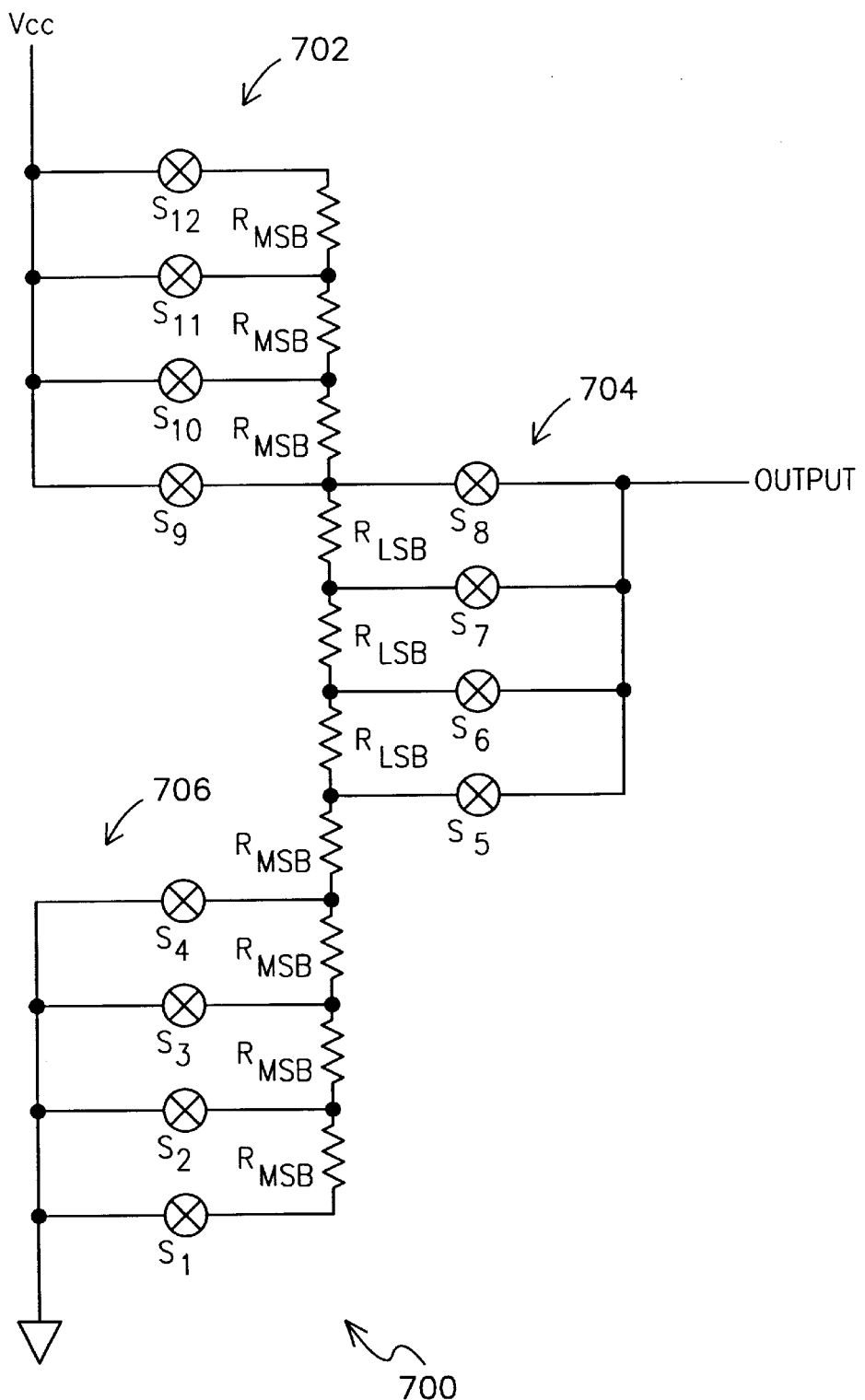
FIG. 7 is a schematic diagram of still another embodiment of the invention.

Referring to FIG. 7, a schematic diagram of a digital potentiometer, according to still another embodiment of the invention, is illustrated. The digital potentiometer is generally referenced by the numeral 700 and comprises a plurality of resistors $R_{MSB}$ and $R_{LSB}$, and a plurality of switches $S_1$–$S_{12}$ connected as illustrated. The resistors $R_{MSB}$ are associated with the switches $S_1$–$S_4$ and $S_9$–$S_{12}$. The resistors $R_{LSB}$ are associated with the switches $S_5$–$S_8$. The switches $S_1$–$S_4$ and associated resistors $R_{MSB}$ are connected in string 706. The switches $S_5$–$S_8$ and associated resistors $R_{LSB}$ are connected in string 704. The switches $S_9$–$S_{12}$ and associated resistors $R_{MSB}$ are connected in string 702.

A respective switch control line (not illustrated) is connected to each of the switches $S_1$–$S_{12}$, and used to activate each of the switches $S_1$–$S_{12}$. The switch control lines may be further controlled by a digital signal coded in binary, octal, decimal, hexadecimal, etc., which may be decoded by an application specific integrated circuit (ASIC), programmable logic array (PLA) or as a digital word from a microcontroller. Control signals are placed on the appropriate switch control lines to activate the desired switches so as to produce the desired resistance value for the digital potentiometer.

The switches $S_1$–$S_4$ and $S_9$–$S_{12}$ are located between the two input reference nodes, Vcc and ground, and the resistors $R_{MSB}$. This configuration helps in reducing the amount of capacitance associated with the output node. Reduced output node capacitance results in faster settling times after a switch change operation and improved alternating current (AC) frequency response.

The placement of the switches $S_1$–$S_4$ in the string 706 and $S_9$–$S_{12}$ in the string 702 further enhances the linearity of the selected resistance values due to less switch resistance variations caused by the body effect of the field effect transistor (FET) switches. This is because there is a more uniform voltage control between the source-gate junctions of the switch FETs, since the sources of the FETs are now typically connected to either the Vcc node or the ground node and do not float with changing resister values as disclosed in U.S. Pat. No. 5,495,245 by James J. Ashe.

The Vcc node may also be used as a first signal input node, and the ground node may be used as a second signal input node. The output node will then work in conjunction with either the common first or second signal input node.

The switches $S_1$–$S_4$ and $S_9$–$S_{12}$ may be controlled by the most significant bits of a digital word and the switches $S_5$–$S_8$ may be controlled by the least significant bits of the digital word. For illustrative purposes, a four bit digital word will be used for illustration, however, it is contemplated and within the scope of the present invention that embodiments thereof may use any number of bits for the digital word, with the only limitations being costs and complexity for a given application.

Referring now to FIG. 8, a table of switches activated for a desired combination of resistors, according to the embodiment of Figure is 7 illustrated. Fractions of the value of Vcc are represented in the left hand column, four bit binary words are represented in the next column to the right, and switch activation patterns are represented by "X"s in each row representing a fraction of the Vcc value. For example, a binary word of 1111 represents full scale or 15/16 Vcc, and switches $S_1$, $S_8$ and $S_9$ are closed. A binary word of 0111 represents half scale or 8/16 Vcc, and switches $S_3$, $S_8$ and $S_{11}$ are closed. All fractions of Vcc in 1/16 increments may be obtained, except 9/16, by appropriate combinations of switch closures as illustrated in FIG. 8. Since there is one $R_{LSB}$ in the middle string 704 connected to the lower string 706, only 1/16 to 16/16 Vcc is obtainable in this embodiment of the present invention. Finer granularity of resistance changes may be obtained with a larger binary control word (more bits) and a corresponding increase in the number of resistors and switches in the strings.

Figure 9:
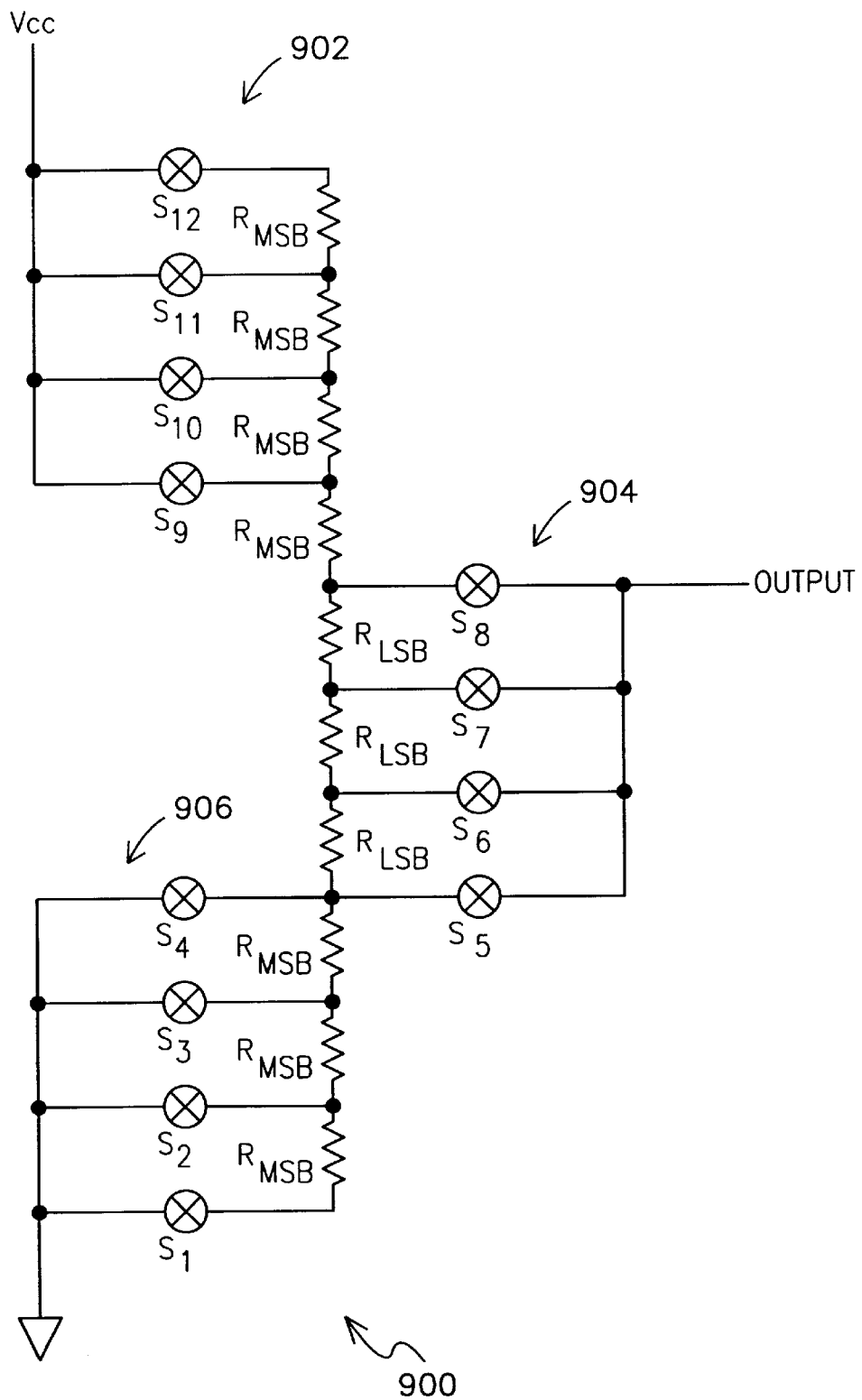
FIG. 9 is a schematic diagram of yet another embodiment of the invention.

Referring to FIG. 9, a schematic diagram of a digital potentiometer, according to yet another embodiment of the invention, is illustrated. The digital potentiometer is generally referenced by the numeral 900 and comprises a plurality of resistors $R_{MSB}$ and $R_{LSB}$, and a plurality of switches $S_1$–$S_{12}$ connected as illustrated. The resistors $R_{MSB}$ are associated with the switches $S_1$–$S_4$ and $S_9$–$S_{12}$. The resistors $R_{LSB}$ are associated with the switches $S_5$–$S_8$. The switches $S_1$–$S_4$ and associated resistors $R_{LSB}$ are connected in string 906. The switches $S_5$–$S_8$ and associated resistors $R_{LSB}$ are connected in string 904. The switches $S_9$–$S_{12}$ and associated resistors $R_{MSB}$ are connected in string 902.

A respective switch control line (not illustrated) is connected to each of the switches $S_1$–$S_{12}$, and used to activate each of the switches $S_1$–$S_{12}$. The switch control lines may be further controlled by a digital signal coded in binary, octal, decimal, hexadecimal, etc., which may be decoded by an application specific integrated circuit (ASIC), programmable logic array (PLA) or as a digital word from a microcontroller. Control signals are placed on the appropriate switch control lines to activate the desired switches so as to produce the desired resistance value for the digital potentiometer.

The switches $S_1$–$S_4$ and $S_9$–$S_{12}$ are located between the two input reference nodes, Vcc and ground, and the resistors $R_{MSB}$. This configuration helps in reducing the amount of capacitance associated with the output node. Reduced output node capacitance results in faster settling times after a switch change operation and improved alternating current (AC) frequency response.

The placement of the switches $S_1$–$S_4$ in the string 906 and $S_9$–$S_{12}$ in the string 902 further enhances the linearity of the selected resistance values due to less switch resistance variations caused by the body effect of the field effect transistor (FET) switches. This is because there is a more uniform voltage control between the source-gate junctions of the switch FETs, since the sources of the FETs are now typically connected to either the Vcc node or the ground node and do not float with changing resister values as disclosed in U.S. Pat. No. 5,495,245 by James J. Ashe.

The Vcc node may also be used as a first signal input node, and the ground node may be used as a second signal input node. The output node will then work in conjunction with either the common first or second signal input node.

The switches $S_1$–$S_4$ and $S_9$–$S_{12}$ may be controlled by the most significant bits of a digital word and the switches $S_5$–$S_8$ may be controlled by the least significant bits of the digital word. For illustrative purposes, a four bit digital word will be used for illustration, however, it is contemplated and within the scope of the present invention that embodiments thereof may use any number of bits for the digital word, with the only limitations being costs and complexity for a given application.

Referring now to FIG. 10, a table of switches activated for a desired combination of resistors, according to the embodiment of Figure is 9 illustrated. Fractions of the value of Vcc are represented in the left hand column, four bit binary words are represented in the next column to the right, and switch activation patterns are represented by "X"s in each row representing a fraction of the Vcc value. For example, a binary word of 1111 represents 15/16 Vcc, and switches $S_1$, $S_8$ and $S_9$ are closed. A binary word of 1000 represents half scale or 8/16 Vcc, and switches $S_2$, $S_5$ and $S_{10}$ are closed. All fractions of Vcc in 1/16 increments may be obtained, except 16/16, by appropriate combinations of switch closures as illustrated in FIG. 10. Since there is one extra $R_{LSB}$ in the middle string 904 connected to the upper string 902, only 0/16 to 15/16 Vcc is obtainable in this embodiment of the present invention. Finer granularity of resistance changes may be obtained with a larger binary control word (more bits) and a corresponding increase in the number of resistors and switches. in the strings.

The invention, therefore, is well adapted to carry out the objects and attain the ends and advantages mentioned, as well as others inherent therein. While the invention has been depicted, described, and is defined by reference to particular preferred embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described preferred embodiments of the invention are exemplary only, and are not exhaustive of the scope of the invention. Consequently, the invention is intended to be limited only by the spirit and scope of the appended claims, giving full cognizance to equivalents in all respects.

What is claimed is:

1. A digital potentiometer, comprising:

a first plurality of switches connected to a first input node;

a second plurality of switches connected to a second input node;

a third plurality of switches connected to an output node;

a first string of series-connected resistors;

a second string of series-connected resistors; and a third string of series-connected resistors, wherein said third string of series-connected resistors are connected between said first and second strings of series-connected resistors, said first plurality of switches are connected between the first input node and said first string of series-connected resistors, said second plurality of switches are connected between the second input node and said second string of series-connected resistors, and said third plurality of switches are connected between the output node and said third string of series-connected resistors.

2. The digital potentiometer of claim 1, wherein:

said first plurality of switches comprise $2^{N/2}$ switches;

said second plurality of switches comprise $2^{N/2}$ switches;

said third plurality of switches comprise $2^{N/2}$ switches;

said first string of series-connected resistors comprise $2^{N/2}-1$ resistors;

said second string of series-connected resistors comprise $2^{N/2}$ resistors; and said third string of series-connected resistors comprise $2^{N/2}-1$ resistors, where N is selected from the group consisting of positive even integer values.

3. The digital potentiometer of claim 1, wherein:

said first plurality of switches comprise $2^{N/2}$ switches;

said second plurality of switches comprise $2^{N/2}$ switches;

said third plurality of switches comprise $2^{N/2}$ switches;

said first string of series-connected resistors comprise $2^{N/2}$ resistors;

said second string of series-connected resistors comprise $2^{N/2}-1$ resistors; and said third string of series-connected resistors comprise $2^{N/2}-1$ resistors, where N is selected from the group consisting of positive even integer values.

4. The digital potentiometer of claim 1, wherein:

said first plurality of switches comprise $2^{N/2}$ switches;

said second plurality of switches comprise $2^{N/2}$ switches;

said third plurality of switches comprise $2^{N/2}$ switches;

said first string of series-connected resistors comprise $2^{N/2}-1$ resistors;

said second string of series-connected resistors comprise $2^{N/2}-1$ resistors; and said third string of series-connected resistors comprise $2^{N/2}$ resistors, where N is selected from the group consisting of positive even integer values.

5. The digital potentiometer of claim 1, wherein each of the resistors in said first and second strings of series-connected resistors has substantially the same resistance value, and said third string of series-connected resistors have substantially the same resistance value as one of the resistors in said first and second strings of series-connected resistors.

6. The digital potentiometer of claim 5, wherein each of the resistors in said third string of series-connected resistors has a resistance value of substantially $2^{-N/2}$ resistance of one of the resistors in said first and second strings of series-connected resistors.

7. The digital potentiometer of claim 1, wherein each of the resistors in said first and second strings of series-connected resistors have substantially the same first resistance value and each of the resistors in said third string of series-connected resistors has substantially the same second resistance value.

8. The digital potentiometer of claim 7, wherein each of the resistors in said first and second strings of series-connected resistors has a resistance value of substantially $2^{-N/2}$ resistance of one of the resistors in said third string of series-connected resistors.

9. The digital potentiometer of claim 1, wherein each resistor of said first string of series-connected resistors is connected to a corresponding one of said first plurality of switches.

10. The digital potentiometer of claim 1, wherein each resistor of said second string of series-connected resistors is connected to a corresponding one of said second plurality of switches.

11. The digital potentiometer of claim 1, wherein each resistor of said third string of series-connected resistors is connected to a corresponding one of said third plurality of switches.

12. The digital potentiometer of claim 1, wherein the first input node is at a positive voltage potential and the second input node is at a ground potential.

13. The digital potentiometer of claim 1, wherein said first, second and third plurality of switches are controlled by a digital word translated with an application specific integrated circuit.

14. The digital potentiometer of claim 1, wherein said first, second and third plurality of switches are controlled by a digital word translated with a programmable logic array.

15. The digital potentiometer of claim 1, wherein said first, second and third plurality of switches are controlled by a software program controlled microcontroller.

16. The digital potentiometer of claim 1, wherein said first, second and third plurality of switches are comprised of field effect transistors.

17. The digital potentiometer of claim 16, wherein said field effect transistors are comprised of N-channel and P-channel transistors.

18. The digital potentiometer of claim 1, wherein said first, second and third plurality of switches are comprised of complementary metal oxide semiconductor field effect transistors.

19. The digital potentiometer of claim 1, wherein said first, second and third plurality of switches, and said first, second and third strings of series-connected resistors are fabricated on an semiconductor integrated circuit die.

20. A method for adjusting a resistance value with a digital potentiometer comprising a first plurality of switches connected to a first input node; a second plurality of switches connected to a second input node; a third plurality of switches connected to an output node; a first string of series-connected resistors; a second string of series-connected resistors; and a third string of series-connected resistors, wherein said third string of series-connected resistors are connected between said first and second strings of series-connected resistors, said first plurality of switches are connected between the first input node and said first string of series-connected resistors, said second plurality of switches are connected between the second input node and said second string of series-connected resistors, and said third plurality of switches are connected between the output node and said third string of series-connected resistors, said method comprising the steps of:

connecting a first desired resistor from the first string of series-connected resistors to the first input node with one of the switches from the first plurality of switches;

connecting a second desired resistor from the second string of series-connected resistors to the second input node with one of the switches from the second plurality of switches; and connecting a third desired resistor from the third string of series-connected resistors to the output node with one of the switches from the third plurality of switches.

21. The method of claim 20, further comprising the step of controlling the first, second and third plurality of switches with a digital word.

22. The method of claim 21, further comprising the steps of connecting the first input note to a voltage, the second input note to a ground and using the output node as an adjustable voltage source having a voltage value between the voltage and ground.

23. The method of claim 22, wherein the adjustable voltage source is determined by the digital word.

24. The method of claim 21, further comprising the steps of connecting the first input note to a ground, the second input note to a voltage and using the output node as an adjustable voltage source having a voltage value between the voltage and ground.

* * * * *